(12) United States Patent
Qing et al.

(10) Patent No.: US 10,418,383 B2
(45) Date of Patent: Sep. 17, 2019

(54) ARRAY SUBSTRATE, FABRICATION METHOD THEREOF AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Haigang Qing, Beijing (CN); Xiaojing Qi, Beijing (CN)

(73) Assignees: BOE TECHNOLOGY GROUP CO., LTD., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 64 days.

(21) Appl. No.: 15/757,928

(22) PCT Filed: Jun. 26, 2015

(86) PCT No.: PCT/CN2015/082467
§ 371 (c)(1),
(2) Date: Mar. 6, 2018

(87) PCT Pub. No.: WO2016/045423
PCT Pub. Date: Mar. 31, 2016

(65) Prior Publication Data
US 2018/0233518 A1    Aug. 16, 2018

(30) Foreign Application Priority Data

Sep. 23, 2014  (CN) .......................... 2014 1 0490190

(51) Int. Cl.
*H01L 27/12* (2006.01)
*G02F 1/13* (2006.01)
(Continued)

(52) U.S. Cl.
CPC ........ *H01L 27/1222* (2013.01); *G02F 1/1368* (2013.01); *G02F 1/133345* (2013.01);
(Continued)

(58) Field of Classification Search
CPC ............... H01L 27/1222; H01L 27/124; G02F 1/133345; G02F 1/134309; G02F 1/136213; G02F 1/136286; G02F 1/1368
See application file for complete search history.

(56) References Cited

U.S. PATENT DOCUMENTS 8,098,008 B2 * 1/2012 Kim .................... H01L 51/5228
                                                    313/504
8,253,907 B2 * 8/2012 Park ..................... G02F 1/1323
                                                    349/106
(Continued)

FOREIGN PATENT DOCUMENTS

CN    101441371 A    5/2009
CN    102033365 A    4/2011
(Continued)

OTHER PUBLICATIONS

International Search Report dated Jun. 26, 2015, issued in counterpart to International Application No. PCT/CN2015/082467 (13 pages).
(Continued)

*Primary Examiner* — Ida M Soward
(74) *Attorney, Agent, or Firm* — Westerman, Hattori, Daniels & Adrian, LLP (57) ABSTRACT

The present disclosure provides an array substrate, a fabrication method thereof, and a display device. The array substrate includes a base substrate, a thin film transistor over the base substrate, a first common electrode over the base substrate, a pixel electrode over the first common electrode and being electrically insulated from the first common
(Continued)

electrode, and a second common electrode disposed over the pixel electrode and being electrically insulated from the pixel electrode. The pixel electrode is electrically connected to a drain electrode of the thin film transistor.

18 Claims, 9 Drawing Sheets

(51) Int. Cl.
G02F 1/1343 (2006.01)
G02F 1/1333 (2006.01)
G02F 1/1362 (2006.01)
G02F 1/1368 (2006.01)

(52) U.S. Cl.
CPC .. *G02F 1/134309* (2013.01); *G02F 1/136213* (2013.01); *G02F 1/136286* (2013.01); *H01L 27/124* (2013.01); *G02F 2001/134318* (2013.01); *G02F 2001/134372* (2013.01); *G02F 2201/121* (2013.01); *G02F 2201/123* (2013.01)

(56) References Cited

U.S. PATENT DOCUMENTS

| | | | | |
|---|---|---|---|---|
| 8,547,510 | B2* | 10/2013 | Matsuyama | G02F 1/133555 349/114 |
| 8,610,862 | B2* | 12/2013 | Kimura | G02B 6/0051 349/141 |
| 8,637,879 | B2* | 1/2014 | Moon | G02F 1/136286 257/88 |
| 9,285,641 | B2* | 3/2016 | Kim | G02F 1/136209 |
| 9,316,881 | B2* | 4/2016 | Kimura | G02F 1/134363 |
| 9,401,393 | B2* | 7/2016 | Kim | H01L 51/5212 |
| 9,581,850 | B2* | 2/2017 | Lee | G02F 1/133512 |
| 2009/0128757 | A1 | 5/2009 | Koshihara et al. | |
| 2011/0085121 | A1 | 4/2011 | Jeon et al. | |
| 2012/0086897 | A1* | 4/2012 | Li | G02F 1/134363 349/123 |
| 2013/0112975 | A1* | 5/2013 | Choi | H01L 27/1248 257/59 |
| 2013/0112983 | A1 | 5/2013 | Kao et al. | |
| 2014/0034954 | A1* | 2/2014 | Yamazaki | H01L 27/1255 257/59 |
| 2014/0184559 | A1* | 7/2014 | Han | G06F 3/0412 345/174 |
| 2017/0300156 | A1* | 10/2017 | Oh | G02F 1/13338 |

FOREIGN PATENT DOCUMENTS

| | | |
|---|---|---|
| CN | 103094069 A | 5/2013 |
| CN | 104280951 A | 1/2015 |
| JP | 2010113264 A | 5/2010 |

OTHER PUBLICATIONS

Office Action dated Sep. 1, 2016, issued in counterpart Chinese Application No. 201410490190.x (8 pages).
Office Action dated Sep. 21, 2017, issued in counterpart Chinese Application No. 201410490190.x (7 pages).
Office Action dated Feb. 24, 2018, issued in counterpart Chinese Application No. 201410490190.x (5 pages).
Office Action dated Apr. 12, 2017, issued in counterpart Chinese Application No. 201410490190.x (7 pages).

* cited by examiner

ARRAY SUBSTRATE, FABRICATION METHOD THEREOF AND DISPLAY DEVICE

CROSS-REFERENCES TO RELATED APPLICATIONS

This application claims the priority of Chinese patent application No. CN201410490190.X, filed on Sep. 23, 2014, the entire content of which is incorporated herein by reference.

FIELD OF THE DISCLOSURE

The present disclosure generally relates to the field of display technologies and, more particularly, relates to an array substrate, a fabrication method and a display device thereof.

BACKGROUND

Thin film transistor liquid crystal display (TFT-LCD) has the advantages of compact size, low power consumption, and radiation free. TFT-LCD is popular in current display device market.

In the fringe field switching (FFS) technology, a fringe electric field may be generated between pixel electrodes in the same plane and may drive liquid crystal molecules between the electrodes and directly over the electrodes to move and transform in a direction parallel to the substrate. The FFS provides a wider viewing angle and improves the light transmittance efficiency of the liquid crystal layer.

The FFS type display device includes an array substrate. The array substrate includes a pixel electrode and a common electrode. During the display stage, a storage capacitor or a pixel capacitor formed by the pixel electrode and the common electrode maintains the pixel voltage on the pixel electrode.

Currently, as the resolution of display devices increases with high aperture, the area occupied by a single pixel in a display device decreases. Accordingly, area of each of the pixel electrode and the common electrode in each pixel cell decreases, which leads to the reduction of the storage capacitance between the pixel electrode and the common electrode and causes the voltage fluctuation on the pixel electrode during the display stage.

The disclosed array substrates, fabrication methods, and display device are directed to at least partially alleviate one or more problems set forth above and to solve other problems in the art.

BRIEF SUMMARY OF THE DISCLOSURE

One aspect or embodiment of the present disclosure provides an array substrate. The array substrate includes a base substrate, a thin film transistor over the base substrate, a first common electrode over the base substrate, a pixel electrode over the first common electrode and being electrically insulated from the first common electrode, and a second common electrode disposed over the pixel electrode and being electrically insulated from the pixel electrode. The pixel electrode is electrically connected to a drain electrode of the thin film transistor.

Optionally, the thin film transistor includes a gate electrode over a first surface portion of the base substrate, a first insulating layer having a first portion over the gate electrode, an active layer over the first portion of the first insulating layer, and a source electrode and the drain electrode both over the active layer. The first common electrode is over a second surface portion of the base substrate.

Optionally, the first insulating layer has a second portion over the first common electrode, and the pixel electrode is over the second portion of the first insulating layer and electrically insulated from the first common electrode.

Optionally, a second insulating layer is over the drain electrode and over the first common electrode. The pixel electrode is over the second insulating layer, the pixel electrode having a portion passing through the second insulating layer to electrically connect to the drain electrode. The first and the second insulating layers are between the first common electrode and the pixel electrode.

Optionally, a third insulating layer is formed over the pixel electrode. The second common electrode is formed over the third insulating layer. Optionally, the first common electrode is a slit-shaped electrode or a plate-shaped electrode. The second common electrode is a slit-shaped electrode.

Optionally, the pixel electrode on a display area of the array substrate has a vertical direction projection to cover the first common electrode.

Optionally, the first and the second common electrodes are both connected to a common electrode line in a non-display area arranged in an edge region of the array substrate. The first and the second common electrodes are configured to have a substantially same electric potential.

Another aspect or embodiment of the present disclosure provides a display device including the disclosed array substrate.

Another aspect or embodiment of the present disclosure provides a method for fabricating an array substrate by providing a base substrate. A thin film transistor is formed over the base substrate. A first common electrode is formed over the base substrate. A pixel electrode is formed over the first common electrode and electrically insulated from the first common electrode. A second common electrode is formed over the pixel electrode and electrically insulated from the pixel electrode. The pixel electrode is electrically connected to a drain electrode of the thin film transistor.

Optionally, thin film transistor is formed by forming a gate electrode over a first surface portion of the base substrate, forming a first insulating layer having a first portion over the gate electrode, forming an active layer over the first portion of the first insulating layer, and forming a source electrode and the drain electrode over the active layer.

Optionally, the first common electrode is formed over a second surface portion of the base substrate. Optionally, the pixel electrode is formed over a second portion of the first insulating layer that is formed over the first common electrode, and the drain electrode is formed over the active layer.

Optionally, a top surface the drain electrode is higher than a top surface of the pixel electrode.

Optionally, a second insulating layer is formed over the drain electrode and over the first common electrode. The pixel electrode is formed over the second insulating layer, the pixel electrode having a portion passing through the second insulating layer to electrically connect to the drain electrode. The first and the second insulating layers are formed between the first common electrode and the pixel electrode.

Optionally, a third insulating layer is formed over the pixel electrode. The second common electrode is formed over the third insulating layer. The first and the second common electrodes are configured to have a substantially same electric potential.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

The objectives, features and advantages of the present disclosure may be more fully understood by persons of ordinary skill in the art with reference to the exemplary embodiments which are described in detail below and are illustrated in the accompanying drawings. Wherever possible, the same reference numbers will be used throughout the drawings to refer to the same or like parts.

Figure 1:
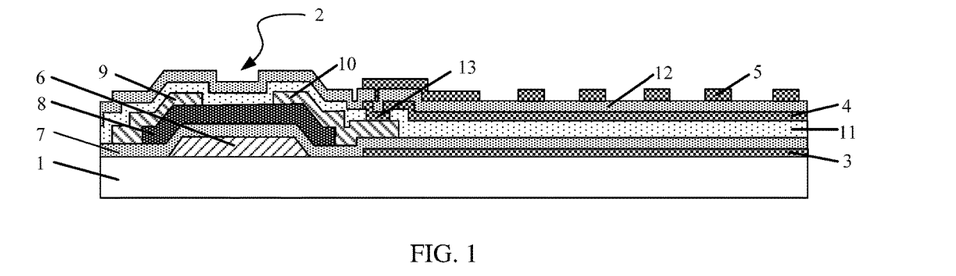
FIG. 1 illustrates a cross sectional structure of an exemplary array substrate according to a first exemplary embodiment of the present disclosure.

FIG. 1 illustrates a cross sectional structure of an exemplary array substrate according to a first exemplary embodiment of the present disclosure. As shown in FIG. 1, the exemplary array substrate may be an FFS array substrate. The array substrate may include a base substrate 1, a thin film transistor (TFT) 2, a first common electrode 3, a pixel electrode 4 and a second common electrode 5.

The thin film transistor 2, the first common electrode 3, the pixel electrode 4 and the second common electrode 5 may be formed over the base substrate 1. The pixel electrode 4 may be located between the first common electrode 3 and the second common electrode 5. The pixel electrode 4 may be electrically connected to a drain electrode 10 of the thin film transistor 2. The pixel electrode 4 may be electrically insulated from each of the first common electrode 3 and the second common electrode 5. The first common electrode 3 and the second common electrode 5 may be configured to have substantially a same electric potential.

Therefore, the first common electrode 3 and the second common electrode 5 may be electrically connected to a common electrode line (not shown) located in a non-display area configured in an edge region of the array substrate. The common electrode line may supply a common voltage to the first common electrode 3 and the second common electrode 5.

In the present embodiment, a bottom gate type thin film transistor may be used as an example. The thin film transistor 2 may include a gate electrode 6, a first insulating layer 7, an active layer 8, a source electrode 9 and a drain electrode 10. The gate electrode 6 may be over a first surface portion of the base substrate 1. The first insulating layer 7 may have a first portion over the gate electrode 6. The active layer 8 may be formed over the first portion of the first insulating layer 7. The source electrode 9 and the drain electrode 10 may be both formed over the active layer 8.

In the present embodiment, a second insulating layer 11 may be formed on the source electrode 9 and the drain electrode 10, covering an entire surface over the base substrate 1. For example, the second insulating layer 11 may be formed on the source electrode 9, the drain electrode 10, a channel region, and the first insulating layer 7 on both sides of the active layer 8. The channel region is the active layer between the source electrode 9 and the drain electrode 10.

The first common electrode 3, the pixel electrode 4 and the second common electrode 5 may be formed over a second surface portion of the base substrate 1. The first insulating layer 7 may have a second portion over the second surface portion of the base substrate 1.

The pixel electrode 4 may be formed over the second insulating layer 11. A via hole 13 may be formed in the second insulating layer 11. The pixel electrode 4 may be electrically connected to the drain electrode 10 through the via hole 13 in the second insulating layer 11. The first insulating layer 7 and the second insulating layer 11 may be located between the first common electrode 3 and the pixel electrode 4.

In addition, a third insulating layer 12 may be formed over the pixel electrode 4. The second common electrode 5 may be formed over the third insulating layer 12. The third insulating layer 12 may be located between the second the common electrode 5 and the pixel electrode 4.

In the present embodiment, a first capacitor may be formed by the first common electrode 3 and the pixel electrode 4. A second capacitor may be formed by the second common electrode 5 and the pixel electrode 4. The first capacitor and the second capacitor may be parallel capacitors. The storage capacitance of the pixel cell may be equal to the summation of the capacitance of the first capacitor and the capacitance of the second capacitor. During the display stage, the first capacitor and the second capacitor may together supply voltage to the pixel electrode 4 to maintain a stable pixel voltage on the pixel electrode 4.

In the present embodiment, the second common electrode 5 may be a slit-shaped electrode. The second common electrode 5 and the pixel electrode 4 may be configured to generate a fringe electric field so as to control movement of liquid crystals in a pixel cell and thus to control the light illumination of the pixel cell.

Optionally, the first common electrode 3 may be a slit-shaped electrode or a plate-shaped electrode. Preferably, the first common electrode 3 may be a plate electrode. When the first common electrode 3 is a plate-shaped electrode, the facing area between the first common electrode 3 and the pixel electrode 4 may be increased. Consequently, the electric charge storage capacity of the first capacitor may be increased.

In addition, in order to prevent the electric field generated by the first common electrode 3 and the pixel electrode 4 from affecting the fringe electric field generated by the second common electrode 5 and the pixel electrode 4, the pixel electrode 4 in the display area may have a projection to cover the first common electrode 3 in a vertical direction, which is a direction perpendicular to a top surface of the array substrate. Thus, the electric field generated by the first common electrode 3 and the pixel electrode 4 may not interfere with the fringe electric field generated by the second common electrode 5 and the pixel electrode 4.

The present disclosure further provides a method of fabricating an array substrate. The fabrication method may include the following.

In Step A: a thin film transistor, a first common electrode, a pixel electrode and a second common electrode may be formed over a base substrate. The pixel electrode may be located between the first common electrode and the second common electrode. The pixel electrode may be electrically connected to the drain electrode of the thin film transistor. The pixel electrode may be electrically insulated from each of the first common electrode and the second common electrode. The first and the second common electrode may be configured to have substantially a same electric potential.

Figure 2:
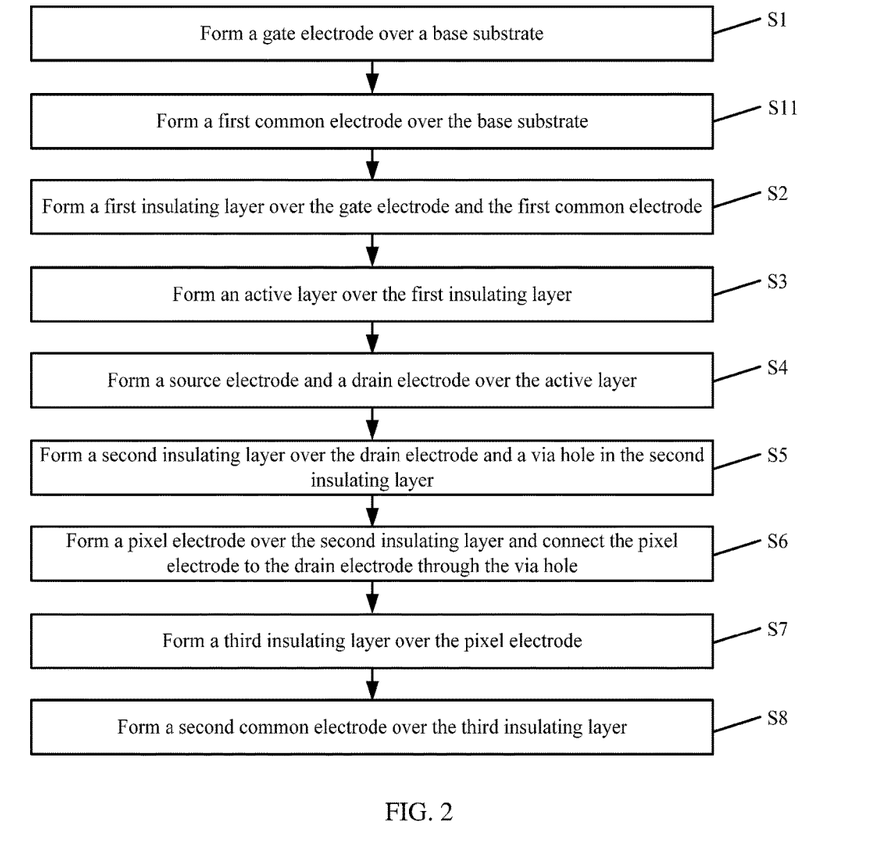
FIG. 2 illustrates a flow chart of an exemplary method for fabricating an exemplary array substrate according to the first exemplary embodiment of the present disclosure.

Illustrated in the accompanying drawings, the process of fabricating the array substrate shown in FIG. 1 is described in detail below with reference to the first exemplary embodiment. For example, FIG. 2 illustrates a flow chart of an exemplary method for fabricating the array substrate shown in FIG. 1. FIGS. 3*a*-3*i* illustrate cross sectional structures of an exemplary array substrate corresponding to certain stages of a fabrication process according to the first exemplary embodiment of the present disclosure. FIGS. 2-3*h* provide structures of the exemplary array substrate corresponding to Step A.

In Step S1 of FIG. 2, a gate electrode is formed over a base substrate.

Figure 3A:
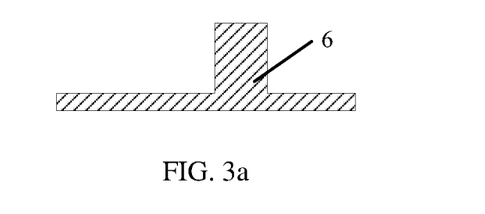
FIGS. 3a-3i illustrate cross sectional structures of an exemplary array substrate corresponding to certain stages of a fabrication process according to the first exemplary embodiment of the present disclosure.

Referring to FIG. 3*a*, a film-forming process may be used to deposit a conductive material such as a metal material on the base substrate 1. Then a patterning process may be used to etch the conductive material to form a gate electrode 6 including a gate line, which may be connected with or extended from the gate electrode 6, and a common electrode line (not shown). The common electrode line may be located in a non-display area configured in the edge region of the array substrate.

It should be noted that the patterning process may include a photolithograph process including, e.g., coating of a photoresist layer, exposure of the photoresist layer using a mask, development of the exposed photoresist layer, etching of the conductive layer under the photoresist layer, and/or stripping of the photoresist layer. The photoresist material used may be, for example, a positive photoresist, a negative photoresist, or any other suitable photoresist material.

In Step S11 of FIG. 2, a first common electrode is formed over the base substrate.

Figure 3B:
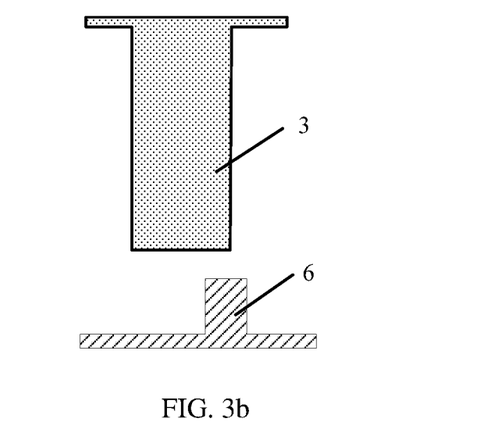

Referring to FIG. 3*b*, a film-forming process may be used to deposit an indium tin oxide (ITO) material layer on the base substrate. Then a patterning process may be used to etch the ITO material layer to form the first common electrode 3. The first common electrode 3 may be a plate-shaped electrode or a slit-shaped electrode. Preferably, the first common electrode 3 is a plate-shaped electrode.

At this point, the first common electrode 3 may be connected to common electrode line (not shown) located in non-display area in the edge region of the array substrate.

It should be noted that the present disclosure does not limit the order for performing Step S11 and Step S1. For example, Step S11 may be executed prior to Step S1, or vice versa.

In Step S2 of FIG. 2, a first insulating layer is formed over the gate electrode and the first common electrode.

Figure 3C:
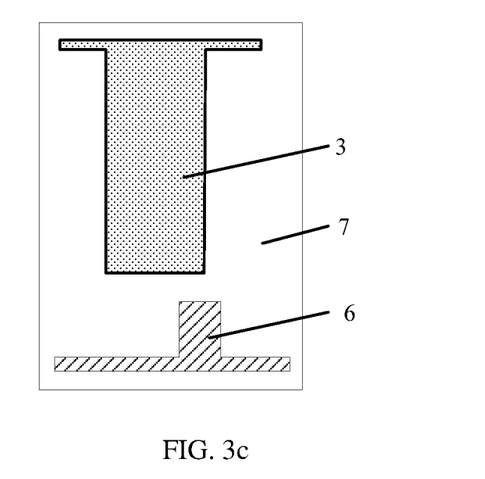

Referring to FIG. 3*c*, a film-forming process may be used to deposit an insulating material layer on the gate electrode 6, the gate line and the first common electrode 3. The insulating material layer may be the first insulating layer 7. For example, the first insulating layer 7 may be made of silicon nitride.

In Step S3 of FIG. 2, an active layer is formed over the first insulating layer.

Figure 3D:
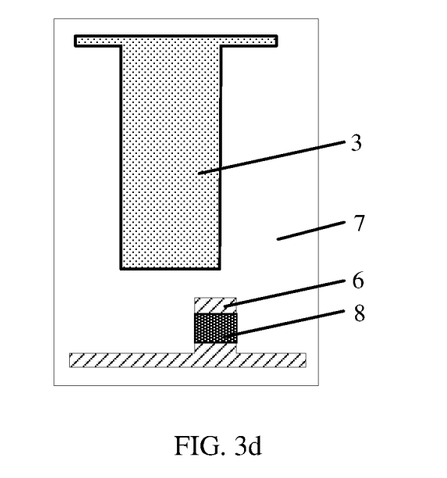

Referring to FIG. 3*d*, a film-forming process may be used to deposit an amorphous silicon material layer over the first insulating layer 7. Then a patterning process may be used to etch the amorphous silicon material layer to form an active layer 8 over a portion of the first insulating layer 7 that is over the gate electrode 6.

In Step S4 of FIG. 2, a source electrode and a drain electrode are formed over the active layer.

Figure 3E:
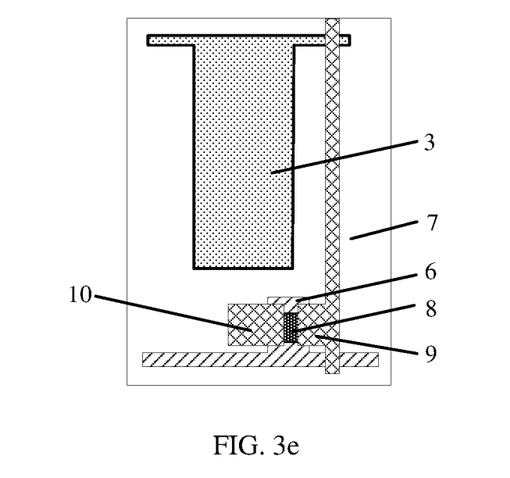

Referring to FIG. 3*e*, a film-forming process may be used to deposit a conductive material layer such as a metal material layer over the active layer 8. Then a patterning process may be used to etch the conductive material layer to form a source electrode 9, a drain electrode 10, and a data line. The data line may be formed together with the source electrode 9.

In Step S5 of FIG. 2, a second insulating layer is formed over the drain electrode, and a via hole is formed in the second insulating layer exposing a surface portion of the drain electrode.

Figure 3F:
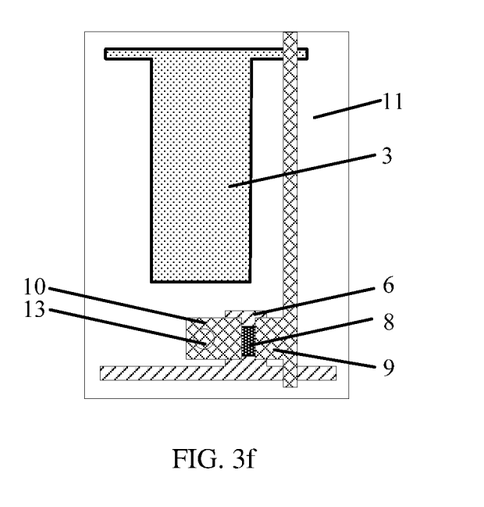

Referring to FIG. 3*f*, a film-forming process may be used to deposit an insulating material layer over the structure shown in 3*e* including the source electrode 9 (along with the data line) and the drain electrode 10. Then a patterning process may be used to etch the insulating material layer to form a via hole 13 in the insulating material layer to expose the drain electrode 10. The remaining insulating material layer may be a second insulating layer 11. It should be noted that the first insulating layer 7 is not shown in FIG. 3*f*.

In Step S6 of FIG. 2, a pixel electrode is formed over the second insulating layer and is connected to the drain electrode through the via hole, e.g., by filling the via hole.

Figure 3G:
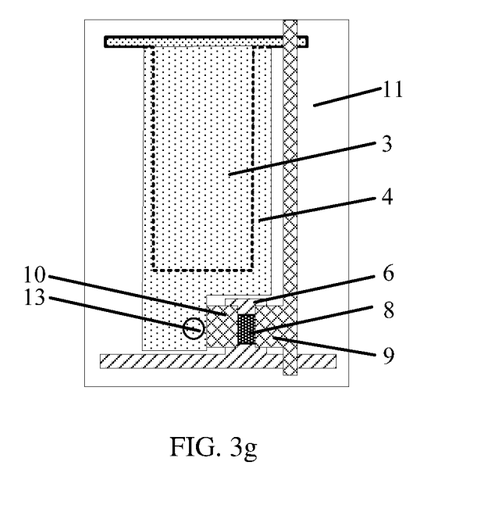
Figures 3H, 3I:
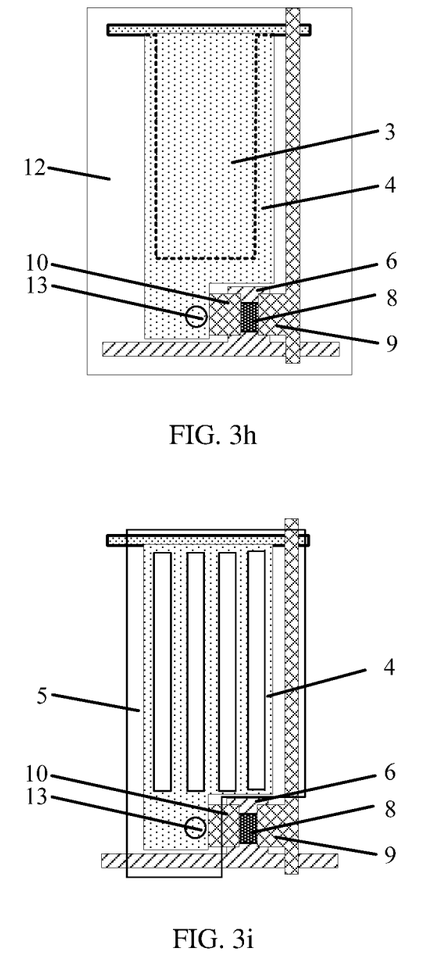

Referring to FIG. 3*g*, a film-forming process may be used to deposit an indium tin oxide (ITO) material layer over the second insulating layer 11. Then a patterning process may be used to etch the ITO material layer to form a pixel electrode 4. The pixel electrode 4 may be connected to the drain electrode 10 through the via hole 13.

In Step S7 of FIG. 2, a third insulating layer is formed over the pixel electrode.

Referring to FIG. 3*h*, a film-forming process may be used to deposit an insulating material layer over the pixel electrode 4. The insulating material layer may be a third insulating layer 12.

It should be noted that the first insulating layer 7, the second insulating layer 11 and the third insulating layer 12 are sequentially formed over the common electrode line in the edge region of the array substrate. After the step S7 is executed, a patterning process may be used to remove the portion of each of the first insulating layer 7, the second insulating layer 11, and the third insulating layer 12, that covers the common electrode line. In other cases, another via hole may be formed through the first insulating layer 7, the second insulating layer 11, and the third insulating layer 12 to expose the common electrode line. Note that the second insulating layer 11 is not shown in FIG. 3h.

In Step S8 of FIG. 2, a second common electrode is formed over the third insulating layer.

Referring to FIG. 3i, a film-forming process may be used to deposit an indium tin oxide (ITO) material layer over the third insulating layer 12. Then a patterning process may be used to etch the ITO material layer to form a second common electrode 5. In one embodiment, the second common electrode may be a slit-shaped electrode.

At this point, the second common electrode 5 may be connected to the common electrode line in the edge region of the array substrate.

As such, the first embodiment of the present disclosure provides an array substrate and a fabrication method thereof. The array substrate may include a base substrate, a thin film transistor, a first common electrode, a pixel electrode and a second common electrode. The thin film transistor, the first common electrode, the pixel electrode and the second common electrode may be formed over the base substrate.

The pixel electrode may be located between the first common electrode and the second common electrode. The pixel electrode may be electrically connected to the drain electrode of the thin film transistor. The pixel electrode may be electrically insulated from each of the first common electrode and the second common electrode. The first common electrode and the second common electrode may be configured to have substantially a same electric potential.

A first capacitor may be formed by the first common electrode and the pixel electrode. A second capacitor may be formed by the second common electrode and the pixel electrode. The first capacitor and the second capacitor may be parallel capacitors. The storage capacitance in the pixel cell may be equal to the summation of the capacitance of the first capacitor and the capacitance of the second capacitor. Thus, the storage capacity of the pixel cell may be effectively improved. In high resolution high aperture display devices, even if the area of each of the common electrode and the pixel electrode (or an overlapping area between the common electrode and the pixel electrode) in a pixel cell is significantly small, the storage capacitor in the pixel cell may still have a large electric charge storage capacity.

Figure 4:
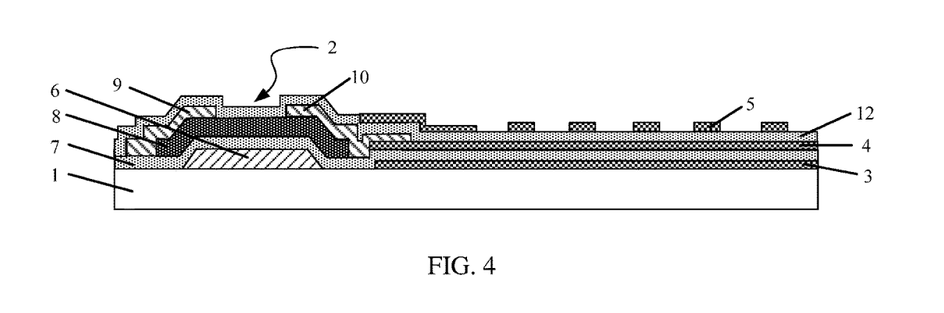
FIG. 4 illustrates a cross sectional structure of another exemplary array substrate according to a second embodiment of the present disclosure.

The second exemplary embodiment of the present disclosure is described below. FIG. 4 illustrates a cross sectional structure of an exemplary array substrate according to the second embodiment of the present disclosure.

As shown in FIG. 4, the exemplary array substrate may be an FFS type array substrate. The array substrate may include a base substrate 1, a thin film transistor 2, a first common electrode 3, a pixel electrode 4 and a second common electrode 5. The thin film transistor 2, the first common electrode 3, the pixel electrode 4 and the second common electrode 5 may be formed over the base substrate 1.

The pixel electrode 4 may be located between the first common electrode 3 and the second common electrode 5. The pixel electrode 4 may be electrically connected to the drain electrode 10 of the thin film transistor 2. The pixel electrode 4 may be electrically insulated from each of the first common electrode 3 and the second common electrode 5. The first common electrode 3 and the second common electrode 5 may be configured to have substantially the same electric potential.

The thin film transistor 2 may include a gate electrode 6, a first insulating layer 7, an active layer 8, a source electrode 9 and a drain electrode 10. The first insulating layer 7 may be formed over the gate electrode 6. The active layer may be formed over the insulating layer 7. The source electrode 9 and the drain electrode 10 may be formed over the active layer 8.

The difference between the array substrate in FIG. 1 and the array substrate in FIG. 4 of the present disclosure may include the following. The second insulating layer and the via hole in the second insulating layer formed in the array substrate in FIG. 1 are not formed in the array substrate in FIG. 4. In other words, the array substrate in FIG. 4 does not include a via hole in the second insulating layer, which may effectively enlarge the aperture ratio of the pixel. In addition, because the array substrate in FIG. 4 does not have the second insulating layer in the array substrate, only the first insulating layer 7 may exist between the first common electrode 3 and the pixel electrode 4. The absence of the second insulating layer may reduce the distance between the first common electrode 3 and the pixel electrode 4 and may consequently increase the capacitance of the first capacitor formed by the first common electrode 3 and the pixel electrode 4. Thus, the storage capacity in a pixel may be further improved.

In some embodiments, the pixel electrode 4 may have a top surface coplanar with a surface portion of the active layer 8. The drain electrode 10 may be formed on the active layer 8, on the pixel electrode 4, and on the insulating layer 7 between the active layer 8 and the pixel electrode 4.

The second exemplary embodiment further provides a method of fabricating the array substrate as shown in FIG. 4. The process for fabricating the array substrate as shown in FIG. 4 is described in detail below with reference to the accompanying drawings.

Figure 5:
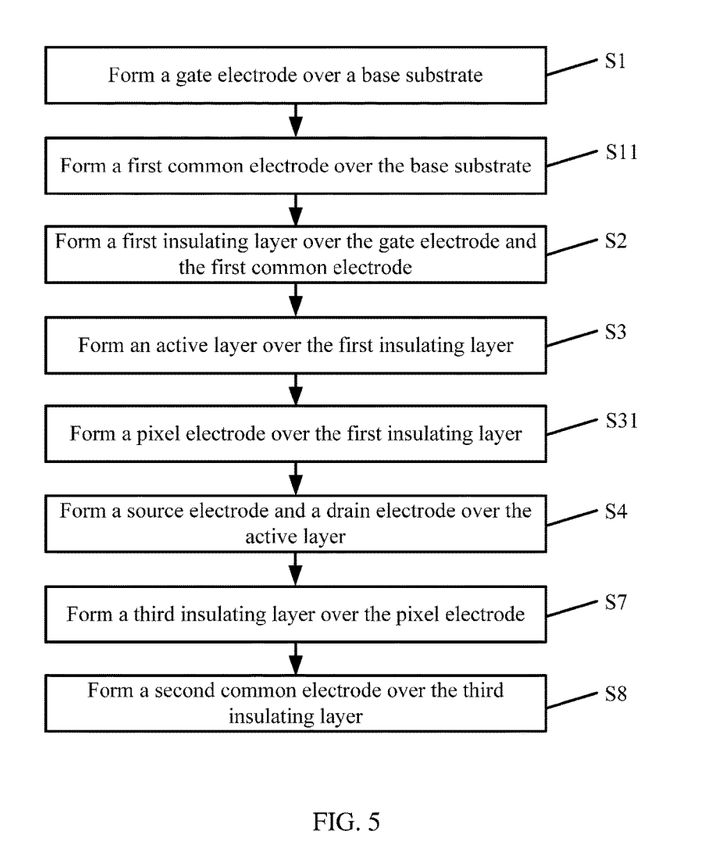
FIG. 5 illustrates a flow chart of an exemplary method for fabricating an exemplary array substrate according to a first exemplary embodiment of the present disclosure.

FIG. 5 illustrates a flow chart of an exemplary method for fabricating the array substrate shown in FIG. 4. As shown in FIG. 5, the fabrication method may include the following steps. Corresponding structures may be shown in FIGS. 3a-3d and FIGS. 6-9.

In Step S1 of FIG. 5: a gate electrode is formed over the base substrate. Referring back to FIG. 3a, a film-forming process may be used to deposit a metal material on the base substrate 1. Then a patterning process may be used to etch the metal material to form a gate electrode 6, a gate line, and a common electrode line (not shown). The gate line may be formed extending from the gate electrode 6. The common electrode line may be formed in the edge region of the array substrate.

In Step S11 of FIG. 5, a first common electrode is formed over the base substrate. Referring back to FIG. 3b, a film-forming process may be used to deposit an indium tin oxide (ITO) material layer on the base substrate. Then a patterning process may be used to etch the ITO material layer to form a first common electrode 3. The first common electrode 3 may be a plate-shaped electrode or a slit-shaped electrode. Preferably, the first common electrode is a plate-shaped electrode.

At this point, the first common electrode 3 may be connected to a common electrode line (not shown) located in the edge region of the array substrate. It should be noted that the present disclosure does not limit the order for performing Step S11 and Step S1. For example, Step S11 may be executed prior to Step S1, or vice versa.

In Step S2 of FIG. 5, a first insulating layer is formed over the gate electrode and the first common electrode. Referring to FIG. 3c, a film-forming process may be used to deposit an insulating material layer over the gate electrode 6, the gate line, and the first common electrode 3 to form the first insulating layer 7. For example, the first insulating layer 7 may be made of silicon nitride.

In Step S3 of FIG. 5, an active layer is formed over the first insulating layer. Referring to FIG. 3d, a film-forming process may be used to deposit an amorphous silicon material layer over the first insulating layer 7. Then a patterning process may be used to etch the amorphous silicon material layer to form an active layer 8.

Figure 6:
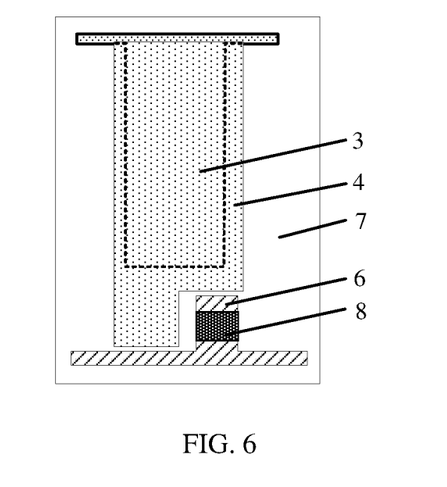
FIG. 6 illustrates a cross sectional structure of an exemplary array substrate after executing a certain fabrication step according to the second exemplary embodiment of the present disclosure.

In Step S31 of FIG. 5, a pixel electrode is formed over the first insulating layer. FIG. 6 illustrates a cross sectional structure of an exemplary array substrate after executing Step S31.

As shown in FIG. 6, a film-forming process may be used to deposit an indium tin oxide (ITO) material layer over the first insulating layer 7. Then a patterning process may be used to etch the ITO material layer to form a pixel electrode 4.

Figure 7:
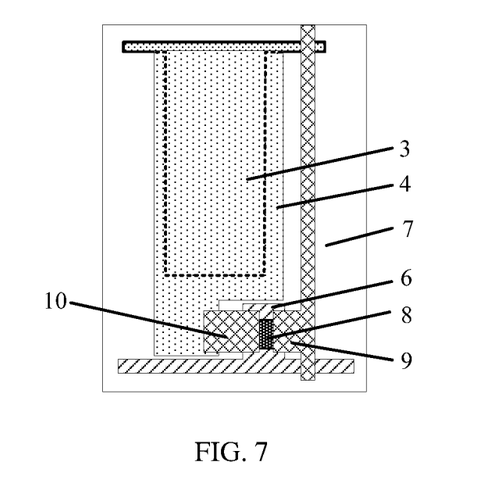
FIG. 7 illustrates a cross sectional structure of an exemplary array substrate after executing another certain fabrication step according to the second exemplary embodiment of the present disclosure.

In Step S4 of FIG. 5, a source electrode and a drain electrode are formed over the active layer. FIG. 7 illustrates a cross sectional structure of an exemplary array substrate after executing step S4.

As shown in FIG. 7, a film-forming process may be used to deposit a metal material layer over the active layer 8. Then a patterning process may be used to etch the metal material layer to form a source electrode 9, a data line extending from the source electrode 9, and a drain electrode 10.

Figure 8:
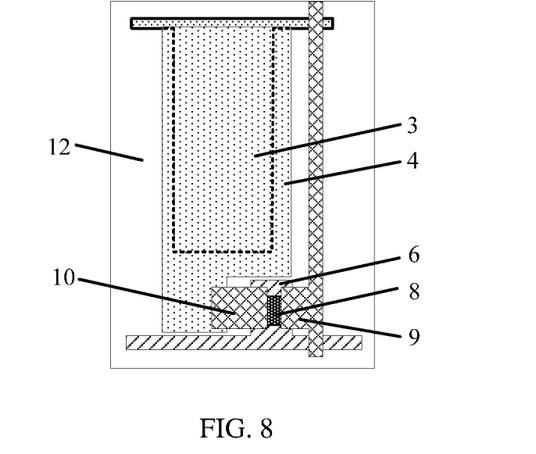
FIG. 8 illustrates a cross sectional structure of an exemplary array substrate after executing another certain fabrication step according to the second exemplary embodiment of the present disclosure.

In Step S7 of FIG. 5, a third insulating layer is formed over the pixel electrode. FIG. 8 illustrates a cross sectional structure of an exemplary array substrate after executing Step S7.

As shown in FIG. 8, a film-forming process may be used to deposit an insulating material layer over the pixel electrode 4 as shown in FIG. 7 to form a third insulating layer 12.

It should be noted that the first insulating layer 7 and the third insulating layer 12 are sequentially formed over the common electrode line in the edge region of the array substrate. After the Step S7 is executed, a patterning process may be used to remove the portion of each of the first insulating layer 7 and the third insulating layer 12 that covers the common electrode line. In other cases, a via hole may be formed through the first insulating layer 7, the second insulating layer 11, and the third insulating layer 12 to expose the common electrode line. In addition, the first insulating layer 7 is not shown in FIG. 8.

Figure 9:
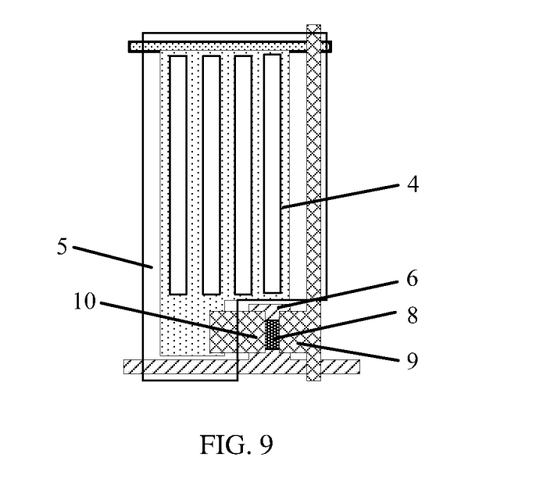
FIG. 9 illustrates a cross sectional structure of an exemplary array substrate after executing another certain fabrication step according to the second exemplary embodiment of the present disclosure.

In Step S8 of FIG. 5, a second common electrode is formed over the third insulating layer. FIG. 9 illustrates a cross sectional structure of an exemplary array substrate after executing Step S8.

As shown in FIG. 9, a film-forming process may be used to deposit an indium tin oxide (ITO) material layer over the third insulating layer 12. Then a patterning process may be used to etch the ITO material layer to form a second common electrode 5. The second common electrode may be a slit-shaped electrode. At this point, the second common electrode 5 may be connected to the common electrode line in the edge region of the array substrate. It should be noted that the third insulating layer 12 is not shown in FIG. 9.

As such, the second exemplary embedment of FIGS. 4-11 of the present disclosure provides an array substrate and a fabrication method thereof. The second embodiment may have all the technical merits described in the first embodiment, without requiring formation of the second insulating layer along with the via hole in the second insulating layer as described in FIGS. 1-3i. This may effectively improve the aperture ratio of the pixel cell.

In addition, because only the first insulating layer exists between the first common electrode and the pixel electrode, the absence of the second insulating layer may reduce the distance between the first common electrode and the pixel electrode and may increase the capacitance of the first capacitor formed by the first common electrode and the pixel electrode. Thus, the pixel capacitance in the pixel cell may be further increased.

Figure 10:
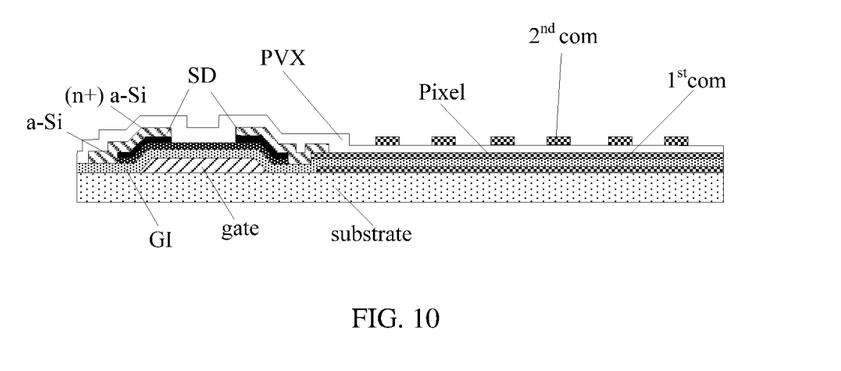
FIG. 10 illustrates a schematic top-down view of another exemplary array substrate according to a third exemplary embodiment of the present disclosure.

FIG. 10 illustrates a specific exemplary array substrate according to the various embodiments of the present disclosure. Similar with the structure shown in FIG. 4, the array substrate in FIG. 10 may include a base substrate, a thin film transistor, a first common electrode, a pixel electrode and a second common electrode. The thin film transistor, the first common electrode, the pixel electrode and the second common electrode may be formed over the base substrate. The pixel electrode may be located between the first common electrode and the second common electrode. The pixel electrode may be electrically connected to the drain electrode of the thin film transistor. The pixel electrode may be electrically insulated from the first common electrode and the second common electrode. The first common electrode and the second common electrode may be configured to have substantially a same electric potential.

The thin film transistor may include a gate electrode (gate), a gate insulating (GI) layer, an active layer (a-Si or amorphous silicon), and source and drain (S/D) electrode. The gate insulating layer may be formed over the gate electrode and the first common electrode. The active layer may be formed over the gate insulating layer in the gate electrode region. The source electrode and the drain electrode may be formed over the active layer.

Compared with the structure shown in FIG. 4, an N-doped amorphous silicon (n+a-Si) may be added between the active layer and the SD electrodes (a-Si or amorphous silicon).

Optionally, the shape and size of the first common electrode may be smaller than that of the pixel electrode. However the present disclosure does not limit the actual shape and size of the first common electrode or the relative position to the edge of the pixel electrode (or the second common electrode).

In this third exemplary embodiment, three transparent electrodes are formed to store pixel electric charges. The pixel electrode is sandwiched between the first common electrode and the second common electrode. The first common electrode is a plate-shaped electrode. The second common electrode is a slit-shaped electrode (e.g., including a comb shape). In addition, the shape and size of the first common electrode, the relative position of the first common electrode edge to the pixel electrode and the second common electrode are not limited. Any configuration variations should be protected in the scope of the present disclosure.

The fourth exemplary embodiment of the present disclosure provides a display device. The display device may include the array substrate provided in the first, the second and/or the third embodiments, e.g., as shown in FIG. 1, FIG. 4, and FIG. 10, respectively.

The disclosed display device may be used in liquid crystal display device, electronic paper, mobile phones, tablet computers, television, monitors, laptops, digital photo frames, navigation systems, and/or other products with display function.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. An array substrate, comprising:
   a base substrate;
   a thin film transistor over the base substrate;
   a first common electrode over the base substrate;
   a pixel electrode over the first common electrode and being electrically insulated from the first common electrode; and
   a second common electrode disposed over the pixel electrode, and being electrically insulated from the pixel electrode, wherein the pixel electrode is electrically connected to a drain electrode of the thin film transistor, and
   wherein a top surface of the drain electrode is higher than a top surface of the pixel electrode.

2. The array substrate of claim 1, wherein the thin film transistor includes:
   a gate electrode over a first surface portion of the base substrate, wherein the first common electrode is over a second surface portion of the base substrate,
   a first insulating layer having a first portion over the gate electrode,
   an active layer over the first portion of the first insulating layer, and
   a source electrode and the drain electrode both over the active layer.

3. The array substrate of claim 2, wherein:
   the first insulating layer has a second portion over the first common electrode, and
   the pixel electrode is over the second portion of the first insulating layer and electrically insulated from the first common electrode.

4. The array substrate of claim 2, further including:
   a second insulating layer over the drain electrode and over the first common electrode,
   wherein:
   the pixel electrode is over the second insulating layer, the pixel electrode having a portion passing through the second insulating layer to electrically connect to the drain electrode, and
   the first and the second insulating layers are between the first common electrode and the pixel electrode.

5. The array substrate of claim 1, further including:
   a third insulating layer formed over the pixel electrode, wherein the second common electrode is formed over the third insulating layer.

6. The array substrate of claim 5, wherein the first common electrode is a slit-shaped electrode or a plate-shaped electrode.

7. The array substrate of claim 5, wherein the second common electrode is a slit-shaped electrode.

8. The array substrate of claim 5, wherein the pixel electrode on a display area of the array substrate has a vertical direction projection to cover the first common electrode.

9. The array substrate of claim 1, wherein the first and the second common electrodes are both connected to a common electrode line in a non-display area arranged in an edge region of the array substrate.

10. The array substrate of claim 1, wherein the first and the second common electrodes are configured to have a substantially same electric potential.

11. A display device, comprising the array substrate of claim 1.

12. A method for fabricating an array substrate, comprising:
    providing a base substrate;
    forming a thin film transistor over the base substrate;
    forming a first common electrode over the base substrate;
    forming a pixel electrode over the first common electrode and electrically insulated from the first common electrode; and
    forming a second common electrode over the pixel electrode and electrically insulated from the pixel electrode, wherein the pixel electrode is electrically connected to a drain electrode of the thin film transistor, and
    wherein a top surface of the drain electrode is higher than a top surface of the pixel electrode.

13. The method of claim 12, wherein the thin film transistor is formed by:
    forming a gate electrode over a first surface portion of the base substrate,
    forming a first insulating layer having a first portion over the gate electrode,
    forming an active layer over the first portion of the first insulating layer, and
    forming a source electrode and the drain electrode over the active layer.

14. The method of claim 13, wherein:
    the first common electrode is formed over a second surface portion of the base substrate.

15. The method of claim 12, further including:
    forming the pixel electrode over a second portion of the first insulating layer that is formed over the first common electrode, and
    forming the drain electrode over the active layer.

16. The method of claim 12, further including:
    forming a second insulating layer over the drain electrode and over the first common electrode,
    wherein:
    the pixel electrode is formed over the second insulating layer, the pixel electrode having a portion passing through the second insulating layer to electrically connect to the drain electrode, and
    the first and the second insulating layers are formed between the first common electrode and the pixel electrode.

17. The method of claim 12, further including:
    forming a third insulating layer over the pixel electrode, wherein the second common electrode is formed over the third insulating layer.

18. The method of claim 12, wherein the first and the second common electrodes are configured to have a substantially same electric potential.

* * * * *